United States Patent
Long et al.

(10) Patent No.: US 6,916,196 B2
(45) Date of Patent: Jul. 12, 2005

(54) PUSH BUTTON DE-LATCH MECHANISM FOR PLUGGABLE ELECTRONIC MODULE

(75) Inventors: Michael D. Long, Hummelstown, PA (US); John E. Westman, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/804,409

(22) Filed: Mar. 19, 2004

(65) Prior Publication Data

US 2004/0185696 A1 Sep. 23, 2004

Related U.S. Application Data

(60) Provisional application No. 60/456,361, filed on Mar. 22, 2003.

(51) Int. Cl.[7] .............................................. H01R 13/627
(52) U.S. Cl. ..................................................... 439/352
(58) Field of Search .............................. 439/352, 350, 439/353, 351, 357, 923

(56) References Cited

U.S. PATENT DOCUMENTS

| | | | |
|---|---|---|---|
| 5,546,281 A | 8/1996 | Poplawski et al. | 361/752 |
| 5,571,023 A | 11/1996 | Anthony | 439/142 |
| 5,717,533 A | 2/1998 | Poplawski et al. | 361/752 |
| 5,734,558 A | 3/1998 | Poplawski et al. | 361/752 |
| 5,810,612 A | 9/1998 | Flask et al. | 439/157 |
| 5,864,468 A | 1/1999 | Poplawski et al. | 361/753 |
| 5,879,173 A | 3/1999 | Poplawski et al. | 438/138 |

(Continued)

OTHER PUBLICATIONS

Sumitomo Electric. Technical Specification for Small Form Factor Pluggable (SFP) Jun., 2002 [online], [retrieved on Feb. 19, 2003]. Retrieved from the Internet: <URL: http://www.excelightcom/pdf/SCP6828c.pdf>.

Infineon Technologies. Small Form Factor Pluggable (SFP) Transceiver Gigabit Ethernet, 1 GBd Fibre Channel, 2x Gigabit Ethernet and Infiniband Multimode 850 nm VCSEL based single Mode 1310 nm FP/DFB Laser based [online], 2002 [retrieved on Feb. 19, 2003]. Retrieved from the Internet <URL: http://www.infineon.com/cmc_upload/documents/036/499//sfp.pdf>.

(Continued)

*Primary Examiner*—Ross Gushi
(74) *Attorney, Agent, or Firm*—Synnestvedt & Lechner LLP

(57) ABSTRACT

A push-button style de-latch mechanism for an SFP MSA fiber optic transceiver or other pluggable optoelectronic or electronic module. The mechanism is readily accessible to an operator and does not require any tools to operate. The mechanism uses translational motion of an actuator to de-latch the module from its receptacle. The actuator is slidable from a first (inoperable) position in which the actuator extends beyond the housing face for tool-free accessibility and operation, to a second position for de-latching the module. The actuator includes a pair of outer legs, each defining a wedge, and an inner leg positioned between the outer legs and having a barb for retaining the actuator on the module. The inner leg deflects to allow the actuator to be easily mounted/demounted from the module's housing for assembly/repair/replacement purposes. Modules and module assemblies including such de-latch mechanisms are also provided.

20 Claims, 6 Drawing Sheets

U.S. PATENT DOCUMENTS

| | | | |
|---|---|---|---|
| 6,019,618 A | | 2/2000 | Nakata .................. 439/157 |
| 6,074,228 A | * | 6/2000 | Berg et al. ............. 439/180 |
| 6,095,862 A | * | 8/2000 | Doye et al. ............ 439/607 |
| 6,149,465 A | * | 11/2000 | Berg et al. ............. 439/630 |
| 6,213,795 B1 | | 4/2001 | Drescher et al. ....... 439/157 |
| 6,335,869 B1 | * | 1/2002 | Branch et al. .......... 361/816 |
| 6,371,787 B1 | * | 4/2002 | Branch et al. .......... 439/352 |
| 6,430,053 B1 | * | 8/2002 | Peterson et al. ........ 361/728 |
| 6,434,015 B1 | * | 8/2002 | Hwang .................. 361/754 |
| 6,439,918 B1 | * | 8/2002 | Togami et al. .......... 439/372 |
| 6,485,322 B1 | * | 11/2002 | Branch et al. .......... 439/357 |
| 6,494,623 B1 | * | 12/2002 | Ahrens et al. ........... 385/76 |
| 6,517,382 B2 | * | 2/2003 | Flickinger et al. ...... 439/607 |
| 6,524,134 B2 | * | 2/2003 | Flickinger et al. ...... 439/607 |
| 6,530,785 B1 | * | 3/2003 | Hwang ................ 439/76.1 |
| 6,532,155 B2 | * | 3/2003 | Green et al. ............ 361/733 |
| 6,533,603 B1 | * | 3/2003 | Togami .................. 439/372 |
| 6,556,445 B2 | * | 4/2003 | Medina .................. 361/728 |
| 6,570,768 B2 | * | 5/2003 | Medina .................. 361/747 |
| 6,609,838 B1 | * | 8/2003 | Branch et al. ........... 385/92 |
| 6,612,858 B1 | * | 9/2003 | Stockhaus .............. 439/352 |
| 6,731,510 B1 | * | 5/2004 | Hwang et al. .......... 361/754 |
| 6,744,963 B2 | * | 6/2004 | Hwang .................. 385/139 |
| 6,746,158 B2 | * | 6/2004 | Merrick ................... 385/53 |
| 6,749,448 B2 | * | 6/2004 | Bright et al. ............ 439/160 |
| 6,758,699 B1 | * | 7/2004 | Hwang et al. .......... 439/676 |
| 6,762,940 B2 | * | 7/2004 | Zaremba ................ 361/728 |
| 6,767,143 B2 | * | 7/2004 | Huang .................... 385/92 |
| 6,771,511 B2 | * | 8/2004 | Bui ....................... 361/728 |
| 6,778,399 B2 | * | 8/2004 | Medina et al. .......... 361/729 |
| 6,780,045 B2 | * | 8/2004 | Shuey et al. ............ 439/489 |
| 6,786,653 B1 | * | 9/2004 | Hwang et al. ............ 385/92 |
| 6,805,574 B2 | * | 10/2004 | Huang .................. 439/357 |
| 6,811,317 B2 | * | 11/2004 | Chiu et al. ............... 385/53 |
| 6,814,502 B2 | * | 11/2004 | Chiu et al. ............... 385/88 |
| 6,819,568 B2 | * | 11/2004 | Cao ....................... 361/728 |
| 6,824,416 B2 | * | 11/2004 | Di Mascio .............. 439/352 |
| 6,832,856 B2 | * | 12/2004 | Chiu et al. ............... 385/53 |
| 6,840,680 B1 | * | 1/2005 | Chiu et al. ............... 385/53 |
| 2002/0072274 A1 | * | 6/2002 | Flickinger et al. ...... 439/607 |
| 2002/0114141 A1 | | 8/2002 | Medina .................. 361/728 |
| 2002/0142649 A1 | | 10/2002 | Baugh et al. ............ 439/532 |
| 2002/0150343 A1 | | 10/2002 | Chiu et al. ............... 385/53 |
| 2002/0150344 A1 | | 10/2002 | Chiu et al. ............... 385/53 |
| 2002/0150353 A1 | | 10/2002 | Chiu et al. ............... 385/88 |
| 2004/0097136 A1 | * | 5/2004 | Flickinger et al. ...... 439/607 |
| 2004/0161958 A1 | * | 8/2004 | Togami et al. .......... 439/160 |
| 2004/0185696 A1 | * | 9/2004 | Long et al. ............. 439/160 |
| 2004/0235332 A1 | * | 11/2004 | Ice ........................ 439/352 |
| 2005/0003696 A1 | * | 1/2005 | Shirk et al. ............. 439/352 |

OTHER PUBLICATIONS

JDS Uniphase. Transceiver, 2.5 Gb/s OC–48, SFP [online], [retrieved on Feb. 19, 2003]. Retrieved from the Internet <URL: http://www.jdsu.com/index2.cfm?NAVCID=5&CID=5&PageName=Transceiver%2C%202%2E5%20Gb%2Fs%20OC%52D48%2C%20SFP&ACT=Display&ProductID=1389&G_ID=10&C_ID=157&s_ID=172&S1_ID=294>.

Stratos Lightwave. Optoelectronic Products. SPLC–20–7–2–X Optical SONET OC–48/SDH STM–16 SFP with FEC –2.67Gbaud –+3.3V [online], [retrieved on Feb. 19, 2003]. Retrieved from the Internet <URL: http://www/stratoslightwave.com/PDF/132–SPLC_20_7_2_X.PDF>.

Optical Communication Products, Inc. CP. TRP–03 & TRP–12 Multimode OC–03/STM–1 & OC–12/STM–4 LC Small form–factor Pluggable (SFP) Multimode Transceivers [online], Mar. 10, 2003, [retrieved on Apr. 2, 2004]. Retrieved from the Internet <URL: http://www.ocp–inc.com/pdfs/TRPD48%20SM.pdf?692>.

Agilent Technologies. Agilent HFCT–5760TL/TP/NL/NP/ATL/ATP/ANL/ANP Single Mode OC–3/STM–1 Small Form Factor Pluggable Transceivers [online], Aug. 11, 2003, [retrieved on Apr. 2, 2004]. Retrieved from the Internet <URL: http://cp.literature.agilent.com/litweb/pdf/5988–9312EN.pdf>.

Sigma–Links. SL4114A–2102. 1.0625/1.25 Gbps Small Form–Factor Pluggable (SFP0 LC Short Wavelength Optical Transceiver, [online], 2002, [retrieved Apr. 2, 2004]. Retrieved from the Internet <URL: http://www.sigma–links.com/data/sl/SL4114A–2102_Spec_1.3.pdf>.

E20. 3.3V Single–Mode LC SFP Transceiver. For SONET OC–48/SDH STM–16 SR–1, IR–1 & IR–2, [online] Jan. 6, 2004, [retrieved on Apr. 2, 2004]. Retrieved from the Internet <URL: http://www.e2oinc.com/html/images/PDF/SFP–LC%2OES248_SR1_IR1_IR2.pdf>.

FINISAR. OC–48 IR–1/STM S–16.1 Multirate Pluggable SFP Transceiver FTRJ1421P1xCL, [online], Sep. 15, 2003, [retrieved Apr. 2, 2004]. Retrieved from the Internet <URL: http://www.finisar.com/optics/documents/FTRJ1421P1xCLSpecRevF.pdf>.

* cited by examiner

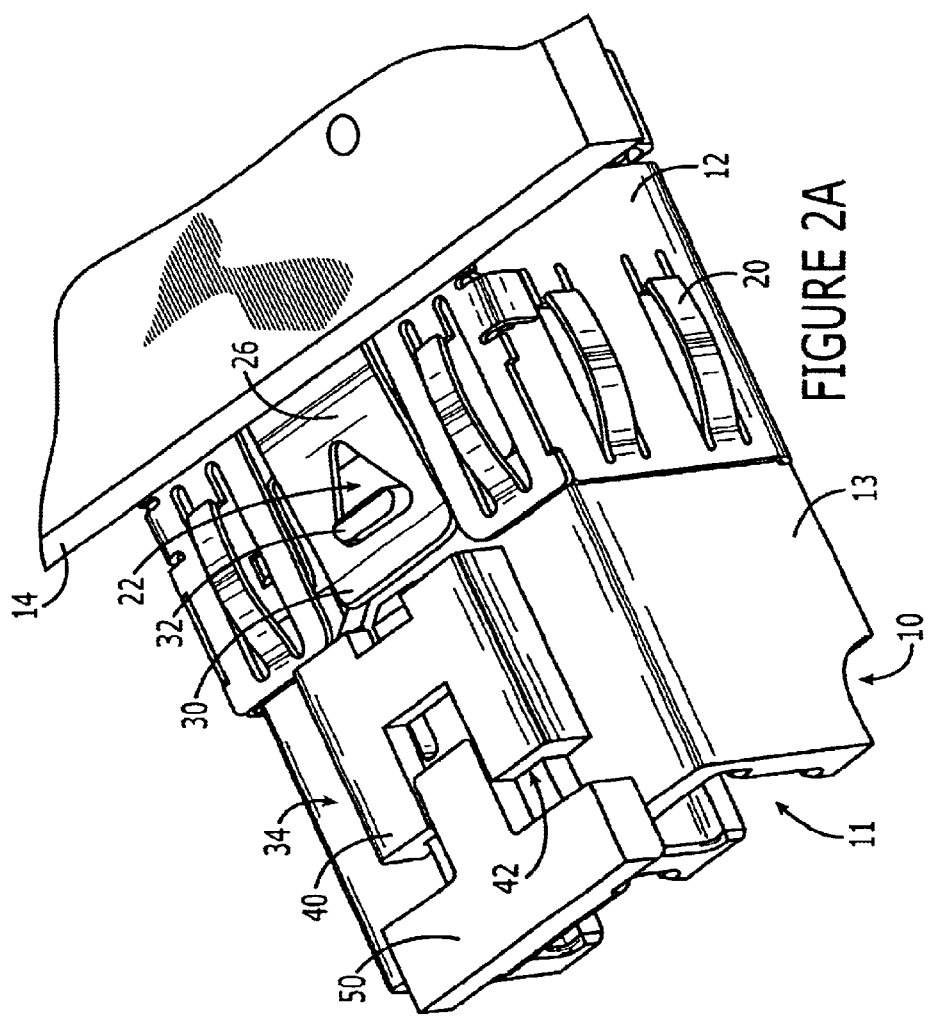

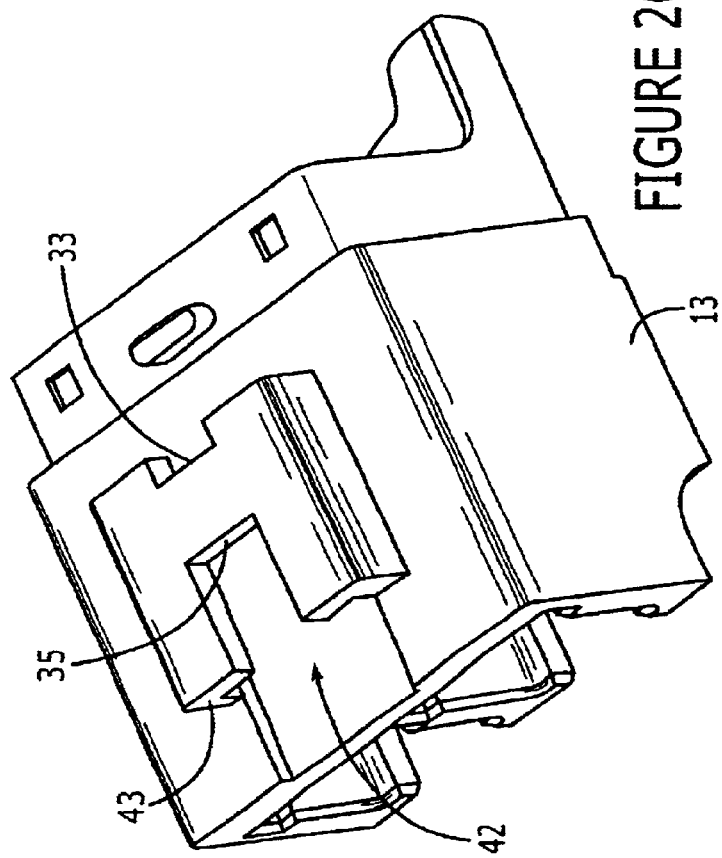

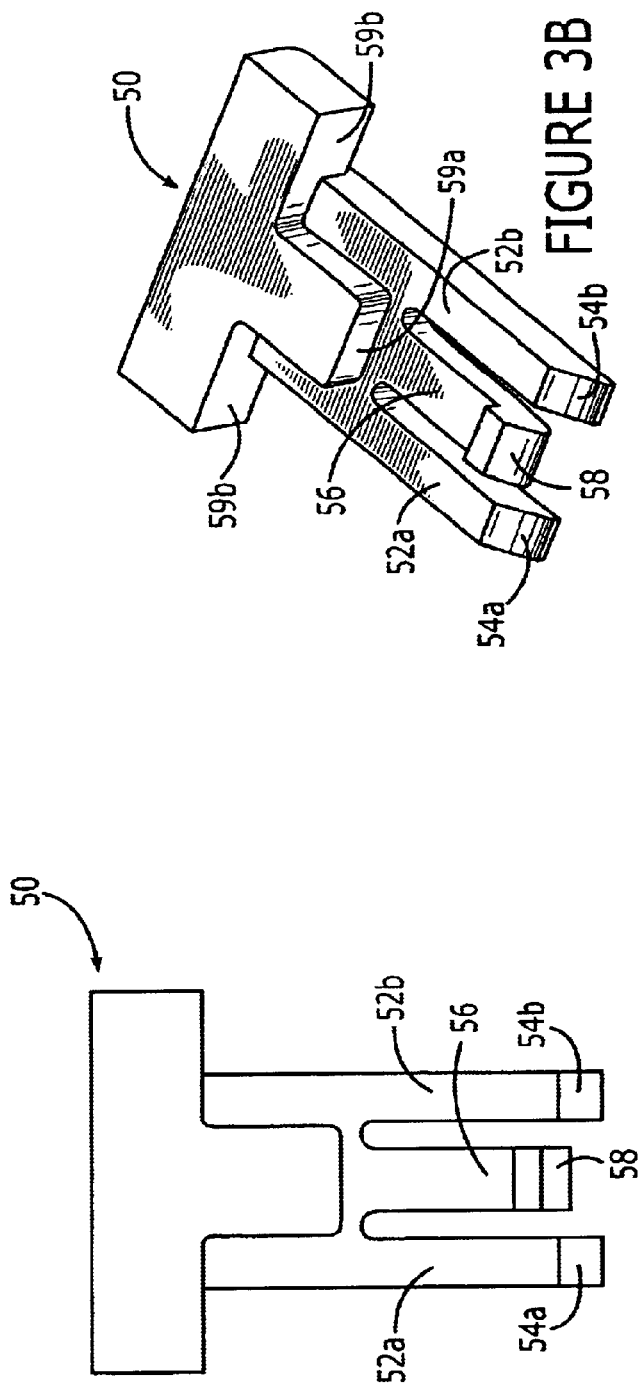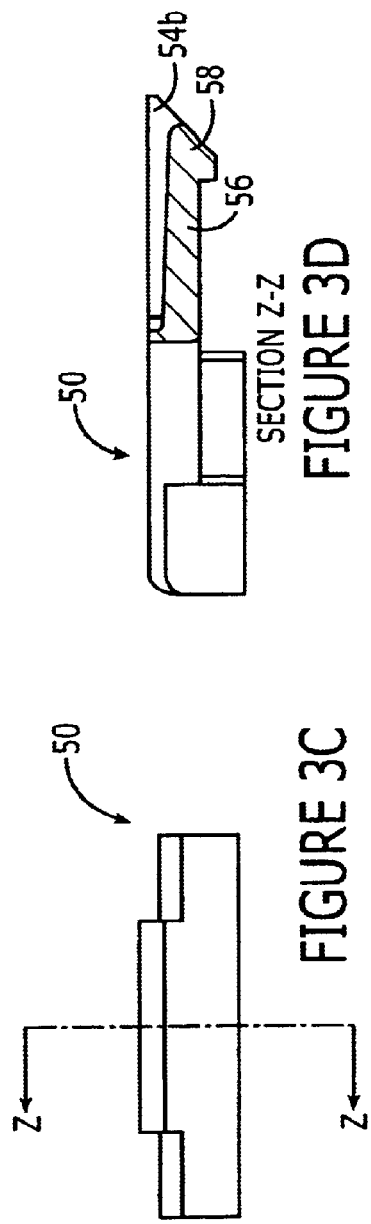

PUSH BUTTON DE-LATCH MECHANISM FOR PLUGGABLE ELECTRONIC MODULE

CROSS-REFERENCE TO RELATED APPLICATIONS

This application claims the benefit of U.S. Provisional Patent Application No. 60/456,361, filed Mar. 22, 2003, the entire disclosure which is hereby incorporated herein by reference.

FIELD OF THE INVENTION

The present invention relates generally to pluggable electronic/optoelectronic modules, such as transceiver modules for high speed fiber optical communications, and, more specifically, to pluggable electronic modules having de-latch mechanisms for unlatching such modules from their receptacles.

BACKGROUND OF INVENTION

It has been known in the pertinent art to dispose electronic modules, particularly optoelectronic transceivers, in a pluggable manner on a printed-circuit board. Known in particular are pluggable transceivers of a small construction, known as Small Form-Factor Pluggable (SFP) transceivers. Standards for SFP transceivers are set forth in the "Small Form-Factor Pluggable (SFP) Transceiver Multisource Agreement (MSA)," dated Sep. 14, 2000, the disclosure of which is hereby incorporated herein by reference. Such transceivers are received in an SFP receptacle on the printed-circuit board. Infrared light is coupled into and out of the transceiver via a plug receptacle that is arranged on the transceiver or coupled to it and into which an optical connector can be plugged. U.S. Pat. Nos. 5,546,281, 5,717,533, 5,734,558, 5,864,468, 5,879,173 and 6,517,382 B2, which disclose exemplary optoelectronic transceivers, are hereby fully incorporated herein by reference. FIG. 1A shows an exemplary transceiver module 10, receptacle 12, and printed circuit board (PCB) 14 of a type generally known in the art, as discussed in detail in U.S. Pat. No. 6,517,382 B2. The receptacle 12 is mounted to the PCB 14 and is preferably constructed of a conductive metal. Contacts 20 ground the receptacle 12 to a stacked array or panel cutout (not shown). The module 10 of FIG. 1A is shown partially inserted into the receptacle 12 so that the components are more clearly illustrated. As shown, the receptacle 12 has a front, back, top, bottom and sides defining a cavity for receiving the module. On the bottom side, the receptacle 12 includes an inclined leading edge 30 and a latch tab 26 defining an opening 22. During insertion of the module 10 into the receptacle 12, the leading edge 30 rides over an outwardly extending latching member 32 on a first side 34 of the module 10, causing the latch tab 26 to be resiliently deflected until the latching member 32 is positioned to enter the opening 22 of the latch tab 26, at which time the latch tab 26 resiles, or snaps back, and latches the module 10 to the receptacle 12. The latching member 32 and the opening 22 are sized and shaped to mate closely, thus preventing movement of the module 10 within the receptacle 12. The module 10 remains latched to the receptacle 12 until the latch tab 26 is displaced to release the latching member 32, at which time the module 10 is de-latched from the receptacle 12 and can be easily withdrawn therefrom.

An exemplary de-latch mechanism is disclosed in U.S. Pat. No. 6,517,382 B2 and shown in FIG. 1A. This exemplary de-latch mechanism is illustrative of those known in the art in that it includes an actuator 50 that is slidably mounted in a slot 42 on a bottom side of the module 10, as shown in FIG. 1A. The actuator includes a ramped portion 54 for displacing the latch tab 26 when the actuator 50 is in an operative position, by causing it to be deflected until the latching member 32 is released from the latch tab 26.

To increase the number of modules per area, multiple SFP modules/receptacles are generally arranged in stacked rows and columns. In such stacked configurations, e.g. a belly-to belly configuration as shown in FIG. 1B, the de-latch mechanism is not readily accessible in that the actuator 50 is positioned between modules and/or behind the face (front) 11 of the module 10 when the actuator 50 is in both the operative and inoperative positions (see FIGS. 1A and 1B). Accordingly, a special tool or probe (not shown) must be inserted into the slot 42 on the module's face 11 and/or between adjacent modules to access and depress the actuator 50. The requirement of a tool for removing the module is not only inconvenient, but also prevents an operator from removing a module if he or she does not have a suitable tool at the appropriate time. This requirement of a tool results in increased installation cost and/or repair time.

Furthermore, it is sometimes desirable to customize a module by color coding or private label trademark branding, or to repair or replace the de-latch mechanism.

Accordingly, there is a need for a pluggable module having a de-latch mechanism that is easily accessible to an operator and does not require any tools to operate, and is readily mountable/demountable for assembly/repair/replacement purposes.

SUMMARY OF THE INVENTION

The present invention provides a push-button style de-latch mechanism for a pluggable electronic/optoelectronic module, such as an SFP MSA fiber optic transceiver module, that fulfills these needs, among others. The push-button de-latch mechanism uses translational motion of an actuator to de-latch the module from its receptacle. The actuator is slidable from a first (inoperable) position in which the actuator extends beyond the housing face for tool-free accessibility and operation. The actuator is specially configured to include a pair of outer legs, each defining a wedge for displacing a receptacle's latch tab, and an inner leg positioned between the outer legs and having a barb for retaining the actuator on the module's housing. The inner leg is resiliently deflectable for displacing the barb to allow the actuator to be easily mounted and/or demounted from the module's housing for assembly/repair/replacement purposes, e.g. to allow for use of a color coded or private label branded actuator.

Modules and module assemblies including such de-latch mechanism is also provided.

BRIEF DESCRIPTION OF THE DRAWINGS

The present invention will now be described by way of example with reference to the following drawings in which:

FIGS. 2A–2C are perspective views of an exemplary pluggable module in accordance with the present invention, shown in the latched and de-latched positions, and FIGS. 3A–3D are a plan, perspective end and cross-sectional views of the actuator of FIGS. 2A and 2B.

DETAILED DESCRIPTION

The present invention provides a push-button style de-latch mechanism that uses translational motion of an actuator to de-latch the module from its receptacle. The de-latch mechanism is of a type suitable for SFP MSA optoelectronic transceiver modules or any other type of pluggable electronic module. The present invention is discussed below with reference to an SFP MSA optoelectronic transceiver module for illustrative purposes.

Figure 1A:
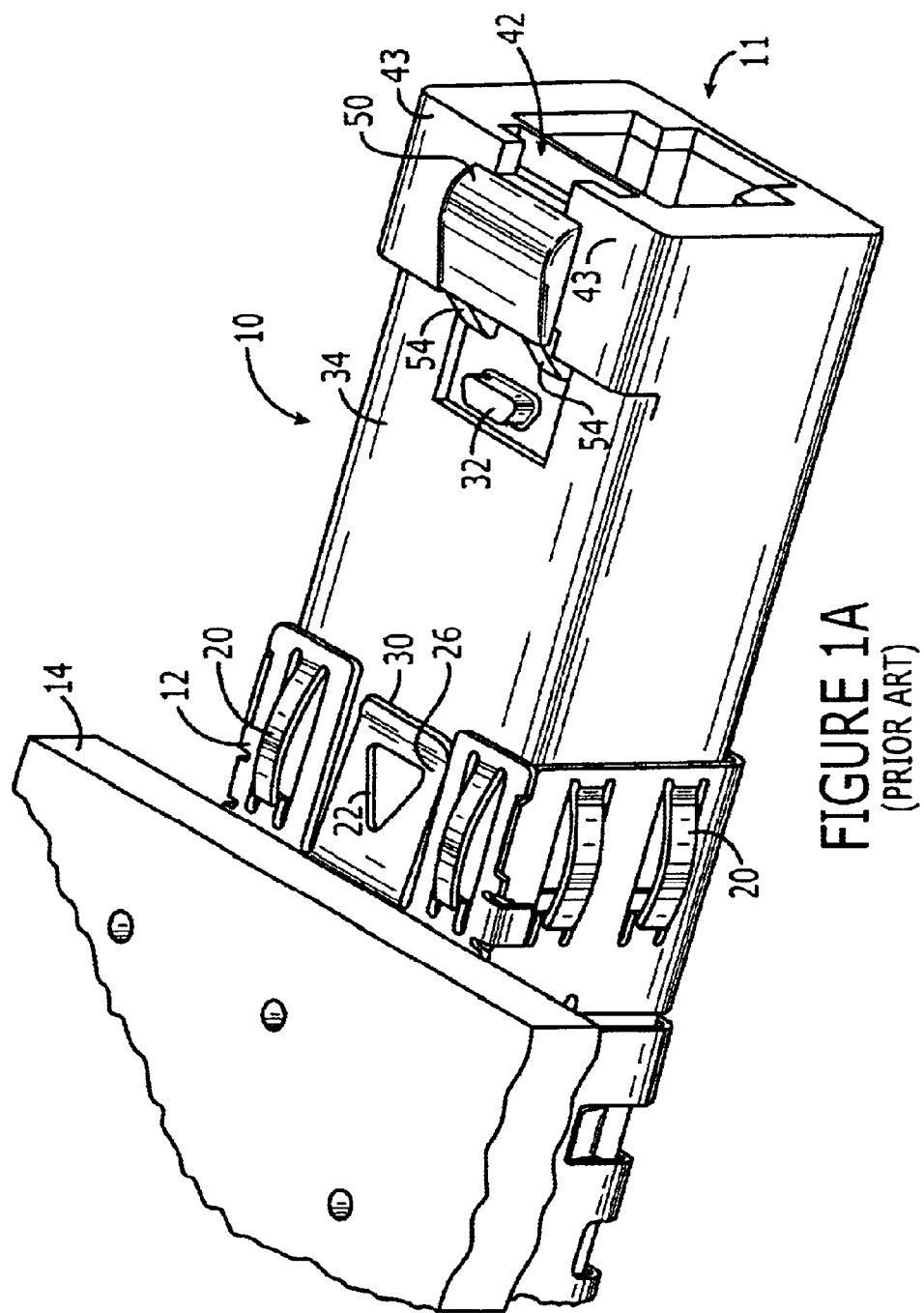
FIGS. 1A and 1B are perspective views of an exemplary transceiver module and receptacle.
Figure 1B:
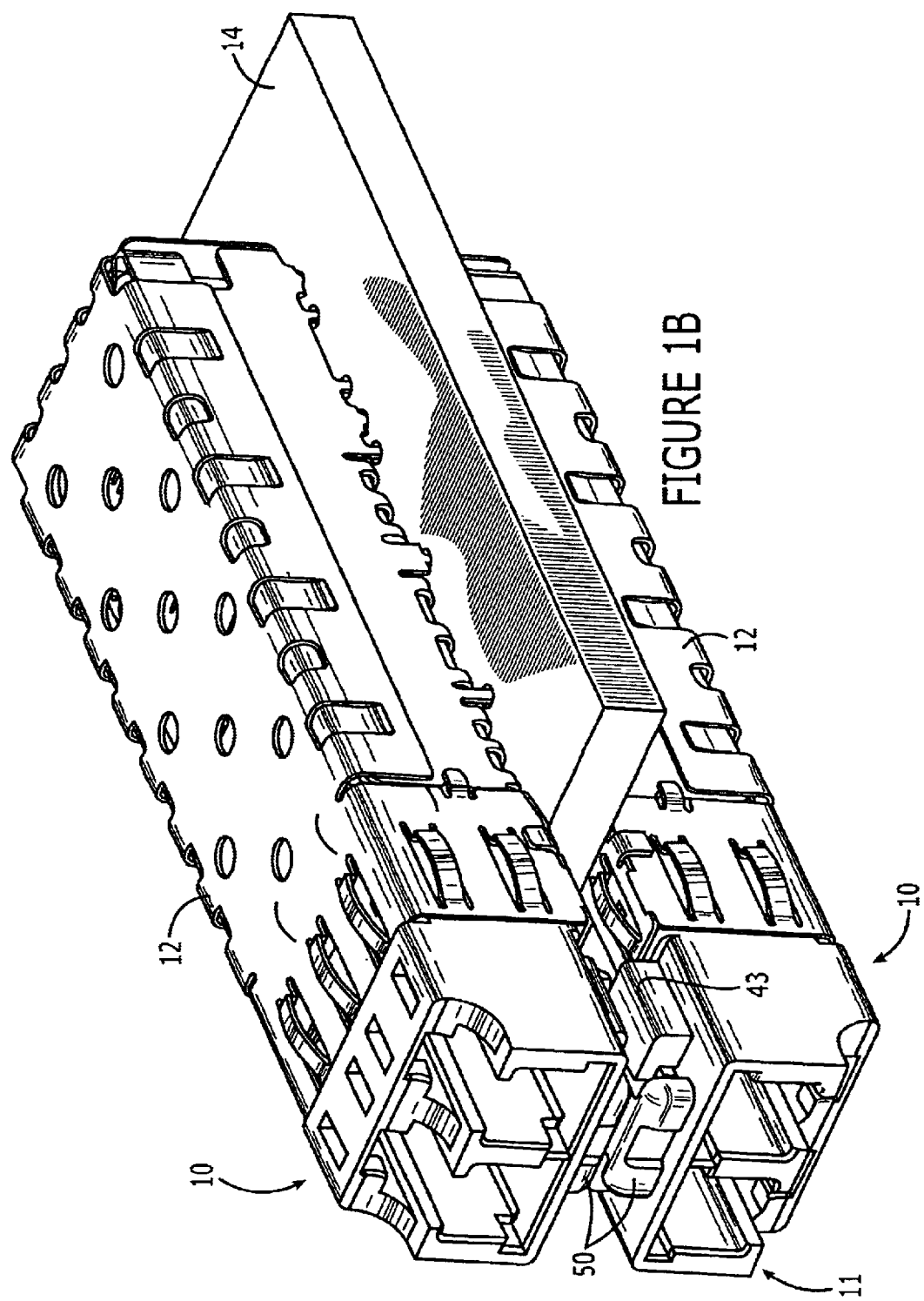
Figure 2B:
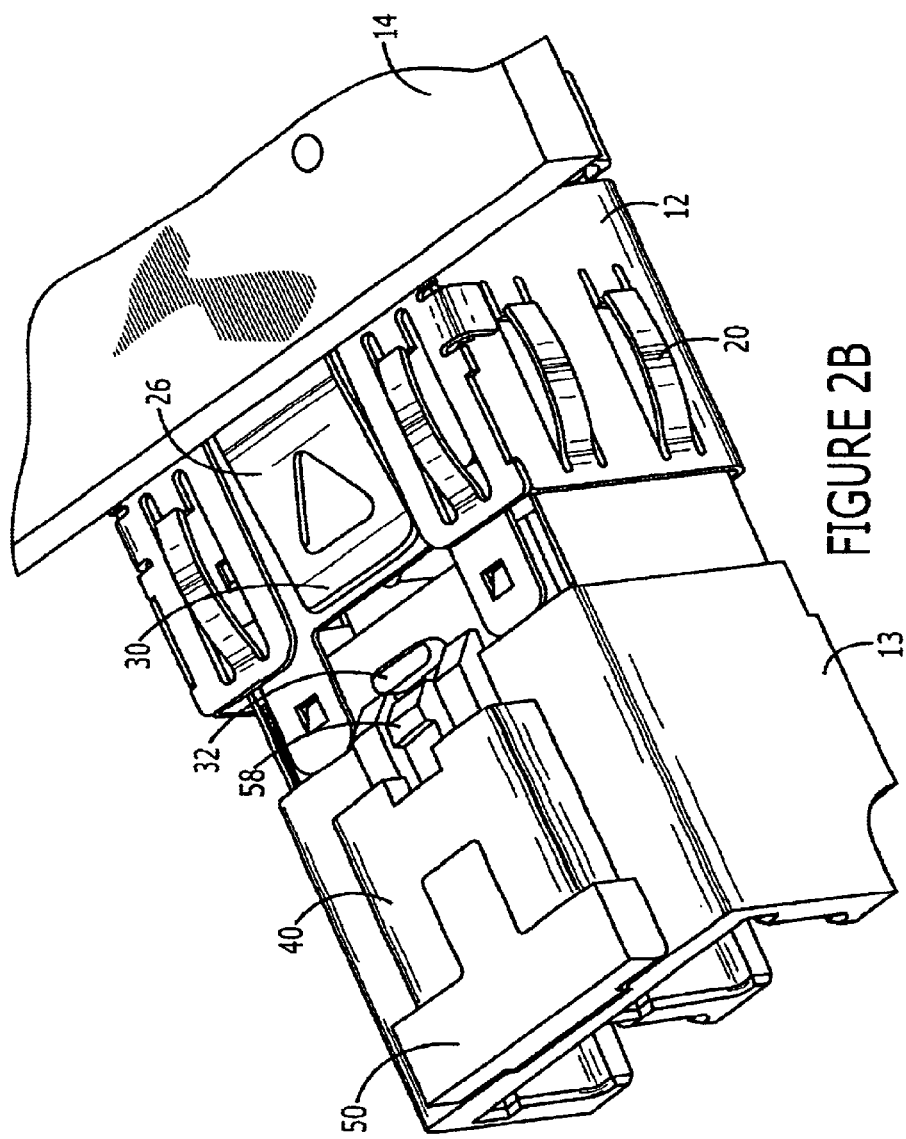

Referring now to the embodiment of FIGS. 2A–2C, a pluggable module 10 according to the present invention resembles a conventional pluggable module, e.g. optoelectronic transceiver, in that it includes, in relevant part, a housing 13 having a face 11, a side 34 transverse to the face 11, and a latching member 32 extending from the side 34 that is sized to mate with the opening 22 in the latch tab 26 of the receptacle 12 for receiving the module 10. In the embodiment of FIGS. 2A–2C, the module 10 includes a continuous hood 40 on the side 34 of the housing 13. The hood 40 forms a closed loop that defines a slot 42 extending adjacent the latching member 32. In an alternative embodiment (not shown), the housing 13 includes L-shaped ribs 43 that define the slot 42, similar to those shown to FIGS. 1A and 1B.

Referring now to FIGS. 2A and 3A–3D, an actuator 50 is slidably mounted in the slot 42. The specially-configured actuator 50 has a pair of outer legs 52a, 52b, each defining a wedge 54a, 54b for displacing the latch tab 26, as discussed further below. In accordance with the present invention, the actuator 50 also includes a resiliently deflectable inner leg 56 positioned between the outer legs 52a, 52b. The inner leg 56 has a barb 58 for retaining the actuator 50 on the module 10, as discussed further below. Accordingly, when the actuator is mounted on the module 10, the actuator 50 is slidable from a first (inoperable) position in which the actuator 50 extends beyond the housing face 11 and the barb 58 interferes with the surface 33 of the housing 13/hood 40 (see FIGS. 2A and 2C), to a second (operable) position in which the wedges 54a and 54b of outer legs 52a, 52b displace the latch tab 26 to release the latching member 32 from its opening 22, thereby de-latching the module 10 from the receptacle 12 when latched thereto.

The inner leg 56 is resiliently deflectable from an assembled position (see FIGS. 2A and 3D) in which the barb 58 interferes with the housing 13/hood 40 when the actuator 50 is attempted to be withdrawn from the slot 42, to an assembly position, in which the inner leg 56 is resiliently deflected such that the barb 58 does not interfere with the surface 33 of the housing 13/hood 40. In this manner, the actuator 50 can be slidably mounted and demounted from the housing 13 by positioning the inner leg 56 in the assembly position. In other words, the inner leg 56 can be depressed during assembly of the actuator 50 to the housing 13 to permit the actuator 50 to be inserted into the slot 42 until the barb 58 escapes the hood 40, at which time the inner leg 56 resiles such that the barb 58 will interfere with the surface 33 if the actuator is attempted to be withdrawn from slot 42. Any suitable materials may be used for the actuator 50 and/or housing 13 such that the legs will deflect for operation without yielding or failing of the material.

Subsequently, the actuator 50 can be easily demounted from the housing 13, e.g. to replace a worn/damaged/defective actuator, to replace with a branded or color-coded actuator, etc., by deflecting the inner leg 56 to its assembly position and then withdrawing the actuator from the housing 13/hood 40/slot 42. The barb 58 and/or the leg 56 can be modified to increase or decrease the interference with the housing 13/hood 40 to vary the ease with which the actuator 50 may be removed from the housing 13.

As best shown in FIGS. 2B and 3B, the barb 58 is positioned on the actuator 50 relative to the wedges 54a, 54b such that the inner leg 56 can resile to cause the barb 58 to interfere with the surface 33 before the wedges 54a, 54b are positioned to deflect the latch tab 26 to release the latching member 32, and while a portion of the actuator 50 extends beyond the face 11 of the module 10. In this manner, there is a portion of the actuator 50 that is accessible from the front of the module 10 for use as a push-button to slide the actuator 50 to a point at which the wedges 54a, 54b deflect the latch tab 26 to release of the latching member 32, thereby permitting withdrawal of the module 10 from its receptacle 12, as shown in FIG. 2B.

Accordingly, the wedges 54a, 54b on the outer legs 52a, 52b are provided to displace the latch tab 26 in a certain plane of motion, e.g. the vertical (up and down) orientation, and the inner leg 56 and barb 58 are resiliently deflectable in the same plane of motion, e.g., the vertical (up and down) orientation, to permit assembly/disassembly and to retain the actuator 50 on the housing 13. The de-latch mechanism can be operated, and the de-latch mechanism can be assembled and disassembled, without the need for special tools, etc.

In certain embodiments, as shown in FIGS. 2A–3D, the actuator 50 includes a primary and/or a secondary stop 59a, 59b that butts up against the surface 33 or the L-shaped ribs 43 to provide a predetermined stopping position for the actuator 50 when it is pressed. This limits the range of motion of the actuator 50 to prevent damage to the latch tab 26 of the receptacle 12. In use, once a module 10 is latched to a receptacle 12, the de-latch mechanisms of the present invention may be used to de-latch the module 10 from the receptacle 12 by pushing the actuator 50 (see FIGS. 3A, 3B). This causes translational motion of the actuator 50 to displace the latch tab 26 of the receptacle 12 to a point at which it releases a corresponding latching member 32 of the module 10. In this manner, the module is de-latched and may be easily withdrawn from the receptacle 12. It will be appreciated that no special tools are required to operate the de-latch mechanisms of the present invention, and that the relevant operative portions of the de-latch mechanisms are readily accessible at a front/face of the module, for easy access even when modules are stacked in a belly-to-belly or other stacked configuration.

Having thus described particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A pluggable module capable of being mounted in a receptacle, the receptacle having a latch tab defining an opening:

a housing having a face and a side transverse to the face, the housing having a latching member that extends from the side and is sized for receipt in the opening in the latch tab, the housing defining a slot extending adjacent the latching member; and an actuator slidably mounted in the slot, the actuator having a pair of outer legs, each defining a wedge, and a resiliently deflectable inner leg having a barb, the inner leg being positioned between the outer legs, the actuator being slidable from a first position in which the actuator extends beyond the housing's face and the barb interferes with the housing to limit sliding movement relative to the slot, to a second position in which the outer legs displace the latch tab to release the latching member from the latch tab's opening, thereby de-latching the pluggable module from the receptacle formerly latched thereto.

2. The pluggable module of claim 1, wherein the inner leg is resiliently deflectable from an assembled position in which the barb interferes with the housing, to an assembly position, in which the barb does not interfere with the housing to limit sliding movement relative to the slot, whereby the actuator can be slidably mounted and demounted from the housing by positioning the inner leg in the assembly position.

3. The pluggable module of claim 1, wherein the wedges of the outer legs are configured to displace the latch tab in a certain plane of motion, and wherein the inner leg is resiliently deflectable in the certain plane of motion.

4. The pluggable module of claim 1, wherein the housing comprises an optoelectronic transceiver.

5. The pluggable module of claim 1, wherein the housing comprises a continuous hood, the hood defining the slot.

6. The pluggable module of claim 5, wherein the inner leg is resiliently deflectable from an assembled position in which the barb interferes with the housing, to an assembly position, in which the barb does not interfere with the housing to limit sliding movement relative to the slot, whereby the actuator can be slidably mounted and demounted from the housing by positioning the inner leg in the assembly position.

7. The pluggable module of claim 6, wherein the wedges of the outer legs are configured to displace the latch tab in a certain plane of motion, and wherein the inner leg is resiliently deflectable in the certain plane of motion.

8. The pluggable module of claim 1, wherein the housing comprises a pair of opposed L-shaped ribs, the pair of opposed L-shaped ribs cooperatively defining the slot.

9. The pluggable module of claim 8, wherein the inner leg is resiliently deflectable from an assembled position in which the barb interferes with the housing, to an assembly position, in which the barb does not interfere with the housing to limit sliding movement relative to the slot, whereby the actuator can be slidably mounted and demounted from the housing by positioning the inner leg in the assembly position.

10. The pluggable module of claim 9, wherein the wedges of the outer legs are configured to displace the latch tab in a certain plane of motion, and wherein the inner leg is resiliently deflectable in the certain plane of motion.

11. A pluggable module assembly:

a receptacle having a latch tab defining an opening; and a pluggable module having:

a housing having a face and a side transverse to the face, the housing having a latching member that extends from the side and is sized for receipt in the opening in the latch tab, the housing defining a slot extending adjacent the latching member; and an actuator slidably mounted in the hood, the actuator having a pair of outer legs, each defining a wedge, and a resiliently deflectable inner leg having a barb, the inner leg being positioned between the outer legs, the actuator being slidable from a first position in which the actuator extends beyond the housing face and the barb interferes with the housing to limit sliding movement relative to the slot, to a second position in which the outer legs displace the latch tab to release the latching member from the latch tab's opening, thereby de-latching the pluggable module from the receptacle formerly latched thereto.

12. The pluggable module assembly of claim 11, wherein the inner leg is resiliently deflectable from an assembled position in which the barb interferes with the housing to limit sliding movement relative to the slot, to an assembly position, in which the barb does not interfere with the housing, whereby the actuator can be slidably mounted and demounted from the housing by positioning the inner leg in the assembly position.

13. The pluggable module assembly of claim 11, wherein the wedges of the outer legs are configured to displace the latch tab in a certain plane of motion, and wherein the inner leg is resiliently deflectable in the certain plane of motion.

14. The pluggable module assembly of claim 11, wherein the housing comprises an optoelectronic transceiver.

15. The pluggable module assembly of claim 11, wherein the housing comprises a continuous hood, the hood defining the slot.

16. The pluggable module assembly of claim 15, wherein the inner leg is resiliently deflectable from an assembled position in which the barb interferes with the housing, to an assembly position, in which the barb does not interfere with the housing to limit sliding movement relative to the slot, whereby the actuator can be slidably mounted and demounted from the housing by positioning the inner leg in the assembly position.

17. The pluggable module assembly of claim 16, wherein the wedges of the outer legs are configured to displace the latch tab in a certain plane of motion, and wherein the inner leg is resiliently deflectable in the certain plane of motion.

18. The pluggable module assembly of claim 11, wherein the housing comprises a pair of opposed L-shaped ribs, the pair of opposed L-shaped ribs cooperatively defining the slot.

19. The pluggable module assembly of claim 18, wherein the inner leg is resiliently deflectable from an assembled position in which the barb interferes with the housing, to an assembly position, in which the barb does not interfere with the housing to limit sliding movement relative to the slot, whereby the actuator can be slidably mounted and demounted from the housing by positioning the inner leg in the assembly position.

20. The pluggable module assembly of claim 19, wherein the wedges of the outer legs are configured to displace the latch tab in a certain plane of motion, and wherein the inner leg is resiliently deflectable in the certain plane of motion.

* * * * *